US008859399B2

(12) United States Patent
Zang et al.

(10) Patent No.: US 8,859,399 B2
(45) Date of Patent: Oct. 14, 2014

(54) METHOD OF AT LEAST PARTIALLY RELEASING AN EPITAXIAL LAYER

(75) Inventors: Keyan Zang, Singapore (SG); Jinghua Teng, Singapore (SG); Soo Jin Chua, Singapore (SG)

(73) Assignee: Agency for Science, Technology and Research, Connexis (SG)

( * ) Notice: Subject to any disclaimer, the term of this patent is extended or adjusted under 35 U.S.C. 154(b) by 818 days.

(21) Appl. No.: 13/130,173

(22) PCT Filed: Nov. 19, 2009

(86) PCT No.: PCT/SG2009/000435
§ 371 (c)(1),
(2), (4) Date: Jul. 22, 2011

(87) PCT Pub. No.: WO2010/059131
PCT Pub. Date: May 27, 2010

(65) Prior Publication Data
US 2011/0294281 A1    Dec. 1, 2011

Related U.S. Application Data

(60) Provisional application No. 61/116,068, filed on Nov. 19, 2008.

(51) Int. Cl.
*H01L 21/02*    (2006.01)
*H01L 33/00*    (2010.01)
*H01L 33/20*    (2010.01)

(52) U.S. Cl.
CPC ...... *H01L 21/0237* (2013.01); *H01L 21/02639* (2013.01); *H01L 33/20* (2013.01); *H01L 33/0079* (2013.01); *H01L 21/02521* (2013.01); *H01L 21/02642* (2013.01); *H01L 21/02664* (2013.01); *H01L 21/0254* (2013.01); *H01L 33/007* (2013.01); *H01L 21/02647* (2013.01); *H01L 21/02458* (2013.01); *Y10S 977/742* (2013.01)
USPC .... 438/478; 257/618; 257/745; 257/E29.005; 257/E33.072; 257/E21.09; 977/742

(58) Field of Classification Search
CPC .............. H01L 21/02371; H01L 21/02647; H01L 21/02603; H01L 21/02636; H01L 33/0079
USPC ............... 438/478; 257/618, 745, E29.005, 257/33.072, 21.09; 977/742
See application file for complete search history.

(56) References Cited

U.S. PATENT DOCUMENTS 5,073,230 A   12/1991   Maracas et al.
6,177,359 B1   1/2001   Chen et al.
(Continued)

FOREIGN PATENT DOCUMENTS

EP        1 422 748 A1   5/2004
WO    WO 2008/096168 A1   8/2008

OTHER PUBLICATIONS

International Search Report PCT/SG2009/000435 dated Feb. 3, 2010.
International Preliminary Report on Patentability PCT/SG2009/000435 dated May 18, 2010.
S.W. Lee et al., "Lattice strain in bulk GaN epilayers grown on CrN/sapphire template", Applied Physics Letters 94, (2005) pp. 082105-1-082105-3.

(Continued)

*Primary Examiner* — Michael Lebentritt
(74) *Attorney, Agent, or Firm* — Foley & Lardner LLP

(57) ABSTRACT

A method of at least partially releasing an epitaxial layer of a material from a substrate. The method comprises the steps of: forming a patterned sacrificial layer on the substrate such that the substrate is partially exposed and partially covered by the sacrificial layer; growing the epitaxial layer on the patterned sacrificial layer by nano-epitaxial lateral overgrowth such that the epitaxial layer is formed above an intermediate layer comprising the patterned sacrificial layer and said material; and selectively etching the patterned sacrificial layer such that the epitaxial layer is at least partially released from the substrate.

22 Claims, 9 Drawing Sheets

(56) References Cited

U.S. PATENT DOCUMENTS

| | | | |
|---|---|---|---|
| 6,201,342 B1* | 3/2001 | Hobart et al. | 313/309 |
| 2002/0027124 A1* | 3/2002 | Bashir et al. | 216/11 |
| 2004/0014297 A1 | 1/2004 | Wu et al. | |
| 2004/0077156 A1 | 4/2004 | Tsakalakos et al. | |
| 2005/0186757 A1 | 8/2005 | Wu et al. | |
| 2006/0118794 A1 | 6/2006 | Lee et al. | |
| 2007/0120254 A1* | 5/2007 | Hurkx et al. | 257/745 |
| 2007/0186629 A1* | 8/2007 | Chang et al. | 73/105 |
| 2009/0061636 A1 | 3/2009 | Lee et al. | |
| 2010/0270460 A1* | 10/2010 | Hillis et al. | 250/208.2 |
| 2011/0024880 A1* | 2/2011 | Li et al. | 257/618 |
| 2012/0280243 A1* | 11/2012 | Lee et al. | 257/76 |
| 2013/0228809 A1* | 9/2013 | Chang et al. | 257/98 |

OTHER PUBLICATIONS

D.J. Rogers et al., "Use of ZnO thin films as sacrificial templates for metal organic vapor phase epitaxy and chemical lift-off of GaN", Applied Physics Letters, 91, (2007) pp. 071120-1-077120-3.

Adele C. Tamboli et al., "Room-temperature continuous-wave lasing in GaN/InGaN microdisks", Nature Photonics, vol. 1, Jan. 2007, pp. 61-64.

K.Y. Zang et al., "Nanoepitaxy to improve the efficiency of InGaN light-emitting diodes", Applied Physics Letters 92, pp. 243126-1-243126-3 (2008).

Y.D. Wang et al., "Improvement of microstructural and optical properties of GaN layer on sapphire by nanoscale lateral opitaxial overgrowth", Applied Physics Letters 88, pp. 211908-1-211908-3 (2006).

* cited by examiner

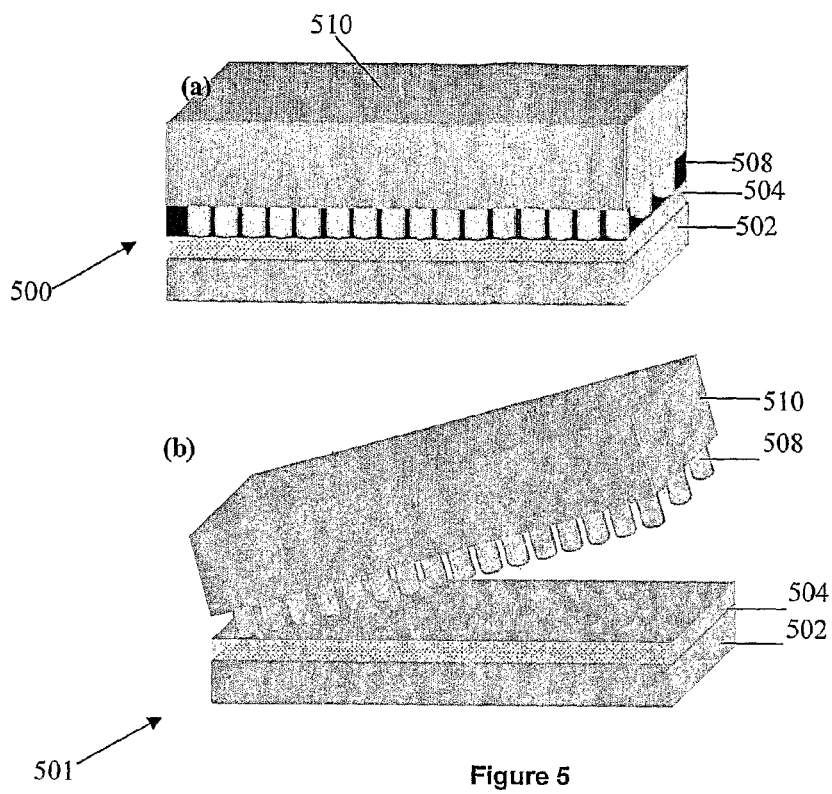
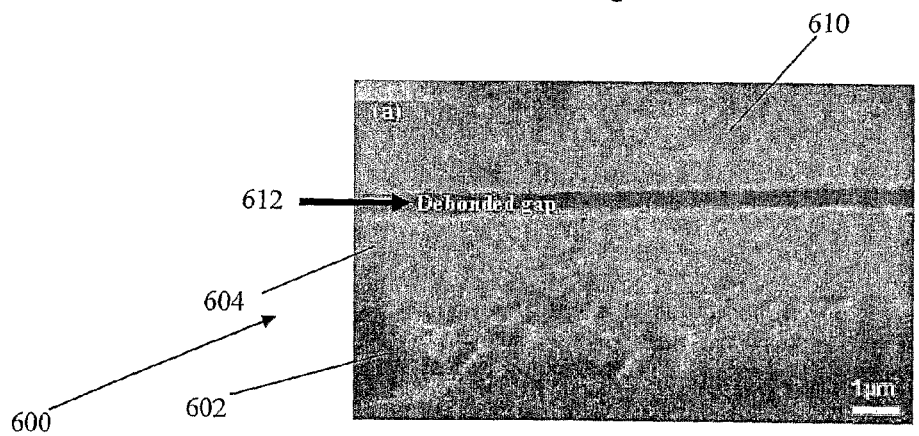
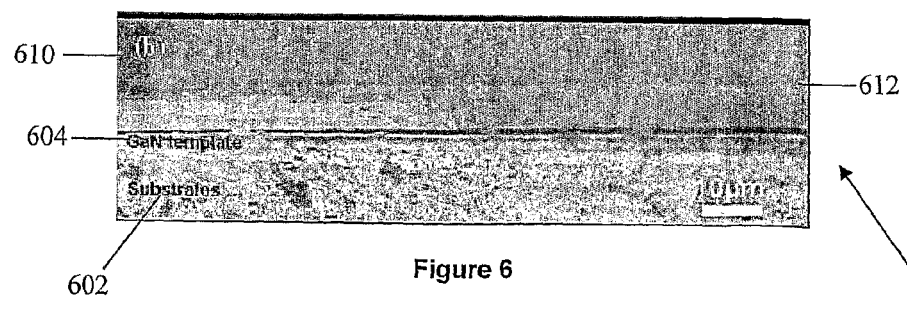
Figure 5
Figure 6

METHOD OF AT LEAST PARTIALLY RELEASING AN EPITAXIAL LAYER

FIELD OF INVENTION

The invention broadly relates to a method of at least partially releasing an epitaxial layer.

BACKGROUND

Lifting-off of epitaxial layers is a process used in the semiconductor industry or other nano-technology related industries. For example, semiconductor materials can be in the form of epitaxial layer materials suitable for a range of potential applications including ultraviolet to visible optoelectronics (e.g. LEDs and lasers) and high temperature electronics (e.g. transistors). Amongst such semiconductor materials, Group III-V nitride semiconductor materials include aluminum nitride (AlN), gallium nitride (GaN), and indium nitride (InN) and their related ternary and quaternary alloys such as aluminum gallium nitride (AlGaN) and indium gallium nitride (InGaN).

Among Group III-V nitride based materials, GaN, a direct-bandgap semiconductor material of wurtzite crystal structure with a wide (3.4 eV) band gap, is currently considered as the prominent semiconductor for applications in optoelectronics (e.g. LEDs from UV to green-blue and white for solid state lighting, laser diodes), and high power and high frequency electronic devices (e.g. High Electron Mobility Transistors (HEMT)). Its sensitivity to ionizing radiation is low, making it a suitable material for solar cell arrays for satellites. Furthermore, since GaN transistors can operate at high temperatures and high voltages, they make ideal power amplifiers at microwave frequencies.

GaN has the advantages of being mechanically hard and chemically inert. However, due to the high melting temperature and the high equilibrium vapor pressure of nitrogen ($N_2$) at the growth temperature to synthesize III-V nitrides, large bulk single crystals for homoepitaxy are costly to produce in high temperature, high pressure conditions and are currently limited to 2 inch wafers. Crystalline GaN is usually grown epitaxially on substrates of dissimilar materials. Silicon (Si), silicon carbide (SiC) and sapphire are the most commonly used substrates, and GaN films are deposited via methods such as, but are not limited to, metal-organic chemical vapor deposition (MOCVD), molecular beam epitaxy (MBE) or hydride vapour phase epitaxy (HVPE). Despite its widespread use, the physical characteristics of sapphire, such as being electrical insulating and its relatively poor thermal conductivity, render it unsuitable for device fabrication. In addition, although these substrates are used for commercial products, there are still issues which degrade the quality of epilayers grown on them. Typically, the epilayers exhibit a crystalline defect level of around $10^8 \sim 10^9$ cm$^{-2}$ due to lattice and thermal mismatches. This high level of crystalline defects is an obstacle to device performance. For example, it leads to low internal light emission efficiency and short life times.

Moreover, besides epilayer quality, bulk substrate properties are far from optimal from a device performance point of view. They inhibit device performance due to their poor thermal and electrical conductivity. The poor thermal conductivity of these substrates prevents efficient dissipation of heat generated by GaN-based high-current devices, such as laser diodes and high-power transistors, which consequently inhibits performance of devices. The poor electrical conductivity of these foreign substrates, especially sapphire, complicates the contact and packaging schemes, resulting in spreading resistance disadvantages and higher voltages for device operation.

One removal technique of a GaN epilayer structure from the sapphire substrate involves the use of a laser to lift off the GaN film that is epitaxially grown on a sapphire substrate. A laser beam irradiates the epilayer through the backside of the substrate, which locally heats the epilayer near the substrate interface and decomposes the epilayer into its constituents, Ga metal and nitrogen gas. After irradiation, the epilayer and the substrate can be separated by heating above the melting point of Ga metal of 30 degrees Celsius. As both GaN and sapphire are transparent at visible wavelengths, an intense lightbeam in the UV wavelength range is required, which can only be produced by an expensive high power laser, such as an excimer laser. The limited beam spot size of a laser means that the beam has to be scanned across a relatively large application area, which can generate transient spatial nonuniformities in heating and thermal expansion across the wafer, thereby cracking the epilayer during laser lift-off. In addition, the relatively expensive laser equipment and short life-time of the laser equipment with low production efficiency render this technique inappropriate for large quantity production. However, it is reported that high energy laser treatment can also cause surface roughness and interdiffusion of aluminum and oxygen into GaN and post polishing is usually required to achieve the desired surface roughness and film thickness. Furthermore, the high energy laser in the process increases the cost of the product.

A second removal method of a GaN epilayer structure from the sapphire substrate is the technique of Epitaxial Lift-Off, which involves the use of a sacrificial layer to be disposed between the epilayer layer and the substrate. A typical sacrificial layer is made of a compound that is chemically distinct from the remaining layers and which can be selectively etched, removed or decomposed, thereby releasing the GaN epilayer structure from the growth substrate.

The ELO method has the following disadvantages. Firstly, it requires the use of a material system that is compatible with the epitaxial growth of GaN, and which can be selectively removed by chemical etching. While there are some reports of using sacrificial layers, for example, GaN/ZnO (as sacrificial layer)/sapphire, or GaN/CrN (as sacrificial layer)/sapphire, however, the material quality is far less optimized. Secondly, the formation of bubbles at the etch site due to a redox reaction during etch layer dissolution may cause the thin GaN layer above to warp and crack, which affects its electrical and optical characteristics. The use of electrochemical etching technique in ELO resolves the bubble formation issue, as reduction is carried out at a remote electrode (cathode).

One variation of the above method comprises the step of applying an electrochemical potential between the layered material/substrate and a counter electrode to oxidize and dissolve a thin etch layer positioned between the film and substrate, which frees the layered material from the substrate.

Another variation of this method is Photoelectrochemical (PEC) Etching, which makes use of a high power UV lamp to selectively excite a sacrificial layer within the GaN-on-sapphire epilayer structure, such that the sacrificial layer is electrochemically etched/dissolved by the electrolyte. Photo-excitation is needed to generate electron-hole pairs to participate in the reactions necessary for material removal.

However, the PEC processes reported to-date result in a rough etched interface with the formation of facet islands or whiskers, thus, post etching or polishing process is needed. And also, the electrolytes usually HCl or KOH used in the PEC etching attack the structure layers near the threading dislocations as well, resulting in a damaged lift-off film on the top surface. In addition, the etching selectivity between the sacrificial layer and structured layers is poor, which makes it difficult to lift-off of the electrically driven device structure with doped GaN and active layers in it.

Besides the concerns above regarding removal of substrate from a GaN epilayer structure, for LED applications, light tends to be trapped in the high-index semiconductor by total internal refraction, which is an issue with regards to light extraction. Considering the refractive indices of GaN (n=2.5) and air, the critical angle for the light escape cone is about 23°. Assuming that light emitted from sidewalls and backside is neglected, one expects that approximately only 4% of the internal light can be extracted from a surface. The light outside the escape cone is reflected into the substrate and is repeatedly reflected, then reabsorbed by active layers or electrode, unless it escapes through the sidewalls. Surface nanopatterning is one of the methods for improving the light extraction as the nanopatterned surface reduces internal light reflection and scatters the light outward.

A need therefore exists to provide a method of at least partially releasing an epitaxial layer that seeks to address at least one of the abovementioned problems.

SUMMARY

According to a first aspect of the present invention, there is provided a method of at least partially releasing an epitaxial layer of a material from a substrate, the method comprising the steps of: forming a patterned sacrificial layer on the substrate such that the substrate is partially exposed and partially covered by the sacrificial layer; growing the epitaxial layer on the patterned sacrificial layer by nano-epitaxial lateral overgrowth such that the epitaxial layer is formed above an intermediate layer comprising the patterned sacrificial layer and said material; and selectively etching the patterned sacrificial layer such that the epitaxial layer is at least partially released from the substrate.

The patterned sacrificial layer may be selectively etched such that the epitaxial layer debonds from the template layer for lift-off.

The epitaxial layer may debond at an interface between the template layer and nano-structures of said material formed on the template layer as part of the nano-epitaxial growth of the epitaxial layer.

The patterned sacrificial layer may be selectively etched such that the epitaxial layer is undercut or such that a cavity is formed underneath the epitaxial layer.

The substrate may comprise a template layer for promoting the non-epitaxial overgrowth.

The template layer and epitaxial layer may comprise a Group III-V nitride; or a Group III-V nitride ternary or quaternary alloy.

The Group III-V nitride may comprise one or more of a group consisting of aluminum nitride (AlN), gallium nitride (GaN), indium nitride (InN), aluminum gallium nitride (AlGaN) and indium gallium nitride (InGaN).

The substrate may comprise one or more of a group consisting of silicon (Si), silicon carbide (SiC) and sapphire.

The template layer may be formed by a method comprising one or more of a group consisting of metal-organic chemical vapor deposition (MOCVD), molecular beam epitaxy (MBE) or hydride vapour phase epitaxy (HVPE).

The patterned sacrificial layer may be formed by a method comprising one or more of a group consisting of plasma enhanced chemical vapor deposition (PECVD), sputtering or spin-on glass.

The patterned sacrificial layer may comprise one or more of a group consisting of silicon dioxide ($SiO_2$), silicon nitride ($Si_3N_4$), and titanium oxide ($TiO_2$).

The patterned sacrificial layer may be patterned by a method comprising one or more of a group consisting of nanoimprint lithography (NIL), use of anodized aluminum oxide (AAO) as an etch mask, electron beam lithography and interference lithography.

The nano-epitaxial lateral overgrowth may be formed by a method comprising one or more of a group consisting of metal-organic chemical vapor deposition (MOCVD), molecular beam epitaxy (MBE) or hydride vapour phase epitaxy (HVPE).

The patterned sacrificial layer may comprise a plurality of pores, dots or strips.

The method may further comprise, prior to etching the patterned sacrificial layer, forming trenches in the substrate to define mesa structures on the substrate, whereby etching of the patterned sacrificial layer in the regions of the mesa structures is facilitated.

The step of forming the patterned sacrificial layer may comprise selecting a pattern based on desired optical characteristics of the lift-off epitaxial layer.

The pattern may be selected to increase a surface roughness of the lift-off epitaxial layer.

The pattern may be selected to provide a diffraction grating on a surface of the lift-off epitaxial layer.

According to a second aspect of the present invention, there is provided a device comprising an epitaxial layer at least partially released using the method as described above.

The device may comprise an LED structure, a Laser Diode or a High Electron Mobility Transistor.

BRIEF DESCRIPTION OF THE DRAWINGS

Example embodiments of the invention will be better understood and readily apparent to one of ordinary skill in the art from the following written description, by way of example only, and in conjunction with the drawings, in which:

FIGS. 5(a)-(b) are perspective views of a self lift-off nano-ELO GaN structure, according to an embodiment of the present invention.

FIG. 6(a) is a SEM image of a de-bonded nano-ELO GaN epitaxial layer after a short period of etching.

FIG. 6(b) is a zoomed-out SEM image, of FIG. 6(a).

DETAILED DESCRIPTION

The present invention relates to a method of at least partially releasing an epitaxial layer from foreign substrates via a combination of nano-epitaxy and wet chemical etching. For illustrative purposes, gallium nitride (GaN), a Group III-V nitride compound is used in the foregoing description. It will be appreciated, however, that this invention can also be applied to other compounds, such as, but are not limited to, Group III-V nitride compounds and their related ternary and quaternary alloys. Group III-V nitride compounds and their related ternary and quaternary alloys include, but are not limited to, aluminum nitride (AlN), indium nitride (InN), aluminum gallium nitride (AlGaN) and indium gallium nitride (InGaN). In addition of the above compounds, other materials systems include III-V semiconductors such as, but are not limited to, GaAs, InP, InAs, AlGaAs, InGaAs; and II-IV semiconductors such as, but are not limited to, CdTe, CdS.

FIGS. 1(a)-(d) are schematic cross-sectional diagrams illustrating the nanofabrication and growth process of a nano-epitaxial lateral overgrown (nano-ELO) GaN epitaxial layer, according to an embodiment of the present invention.

Figure 1:
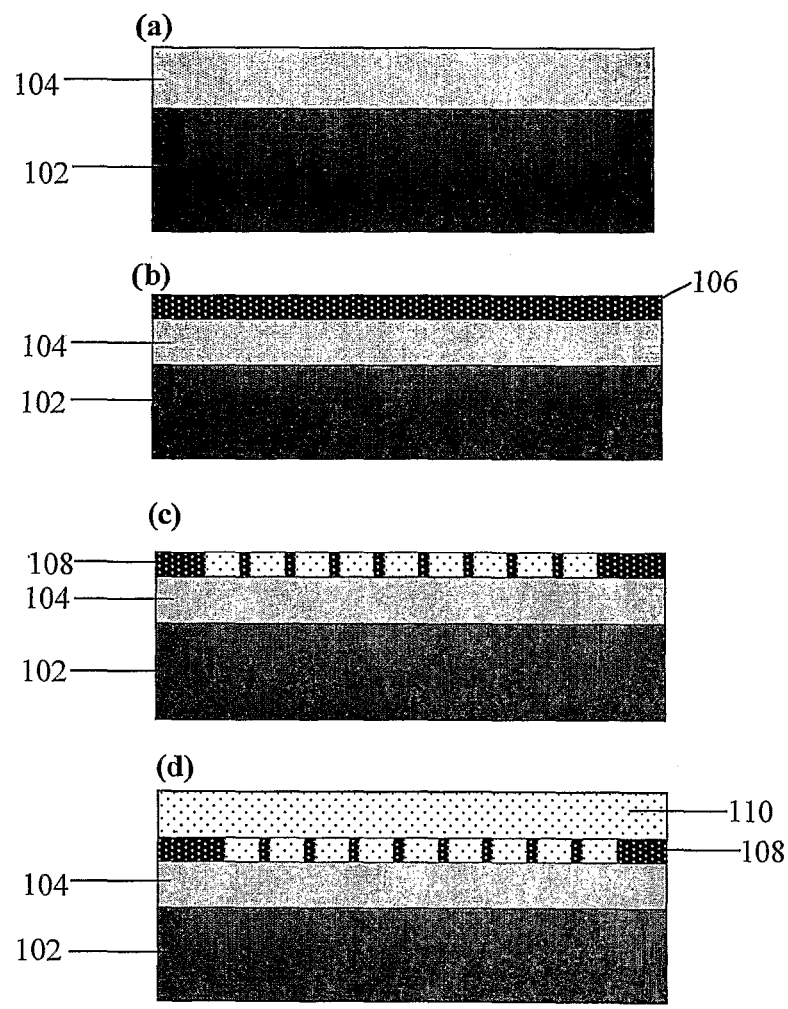
FIGS. 1(a)-(d) are schematic cross-sectional diagrams illustrating the nanofabrication and growth process of a nano-epitaxial lateral overgrown (nano-ELO) GaN epitaxial layer, according to an embodiment of the present invention.

As illustrated in FIG. 1(a), a thin layer of GaN template 104 is grown on a substrate 102. Suitable substrate materials include, but are not limited to, sapphire, silicon carbide (SiC) and silicon (Si). It will be appreciated by a person skilled in the art that the GaN template 104 can be grown via methods such as, but are not limited to, metal-organic chemical vapor deposition (MOCVD), molecular beam epitaxy (MBE) or hydride vapour phase epitaxy (HVPE).

Thereafter, as shown in FIG. 1(b), a sacrificial layer 106 is deposited on the surface of the GaN template 104. Suitable sacrificial layer materials include, but are not limited to, silicon oxide ($SiO_2$), silicon nitride ($Si_3N_4$), and titanium oxide ($TiO_2$). The sacrificial layer 106 is preferably deposited on the GaN template 104 via methods such as, but are not limited to, plasma enhanced chemical vapor deposition (PECVD), sputtering or spin-on glass.

Next, as shown in FIG. 1(c), a nanostructured patterned sacrificial layer 108 is formed from the sacrificial layer 106 (shown in FIG. 1(b)) using nanofabrication and subsequent etching such that the template layer 104 is partially exposed and partially covered by the sacrificial layer 108. Suitable nanofabrication methods include, but are not limited to, nanoimprint lithography (NIL), use of anodized aluminum oxide (AAO) as an etch mask, electron beam lithography and interference lithography.

In one embodiment, the sacrificial layer 106 is created by first depositing an aluminum film (not shown), approximately 1 μm in thickness, by electron beam evaporation on the sacrificial layer 106 (shown in FIG. 1(b)). The aluminum film forms an anodized aluminum oxide (AAO) layer via a two-step anodization process in which the aluminum film is first anodized at about 3° C. in about 0.3M oxalic acid and subsequently subjected to wet treatment with about 5 wt % phosphoric acid ($H_3PO_4$) for about 70 minutes to enlarge the nanopores in the MO layer.

$CHF_3$-based inductively coupled plasma (ICP) etching conditions can then be employed to transfer the nanopores in the anodized aluminum oxide (AAO) layer onto the sacrificial layer 106. The AAO layer can then be removed by a suitable chemical etchant, resulting in closed packed nanopore arrays in the sacrificial layer 106 to form the nanostructured patterned sacrificial layer 108 on the surface of the GaN template 104.

Figure 2:
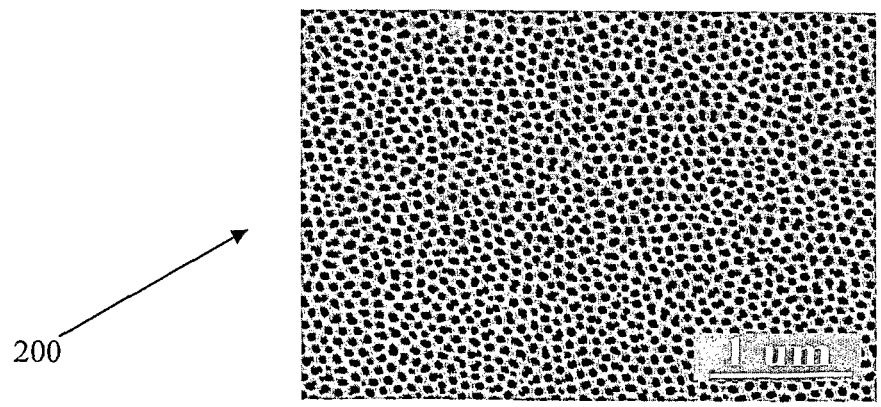
FIG. 2 is a scanning electron microscope (SEM) image of the surface morphology of a nanostructured $SiO_2$ sacrificial layer fabricated using an AAO layer as an etch mask.

FIG. 2 is a scanning electron microscope (SEM) image, designated generally as reference numeral 200, of the surface morphology of a nanostructured $SiO_2$ patterned sacrificial layer fabricated in accordance with an embodiment of the present invention, using an AAO layer as an etch mask. In FIG. 2, the mean pore diameter and interpore distance are about 60 nm and 110 nm respectively.

Figure 3:
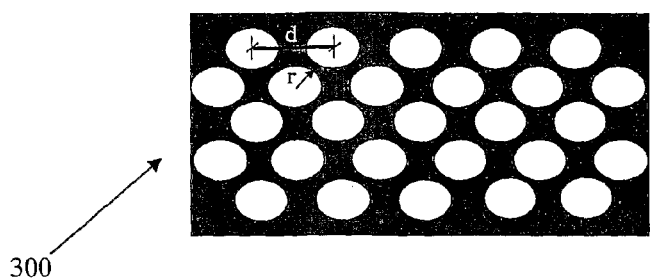
FIG. 3 is a top-view schematic of a nanostructured sacrificial layer comprising nanopores, according to an embodiment of the present invention.

FIG. 3 is a top-view schematic of a nanostructured patterned sacrificial layer, designated generally as reference numeral 300, comprising nanopores, according to an embodiment of the present invention. The pore radius and interpore distance are designated by r and d respectively. Patterns (e.g. pores, stripes, dots, etc) on the nanostructured patterned sacrificial layer are advantageously in nanometer scale (i.e.: about less than 1 μm) so as to facilitate subsequent self lifting-off of an epitaxial layer and enhance light output from the epitaxial layer. The patterned sacrificial layer is formed by selecting a pattern based on desired optical characteristics of the lift-off epitaxial layer. For example, the pattern selected can be a network of stripes which form a diffraction grating. Surface roughness can be another factor in selecting a pattern.

With reference to FIG. 1(d), a continuous GaN epitaxial layer 110 is grown by a nano-epitaxial lateral overgrown (nano-ELO) method over the nanopatterned patterned sacrificial layer 108. The nano-epitaxial lateral overgrowth is advantageously carried out using methods such as, but are not limited to, metal-organic chemical vapor deposition (MOCVD), molecular beam epitaxy (MBE) or hydride vapour phase epitaxy (HVPE).

Figure 4:
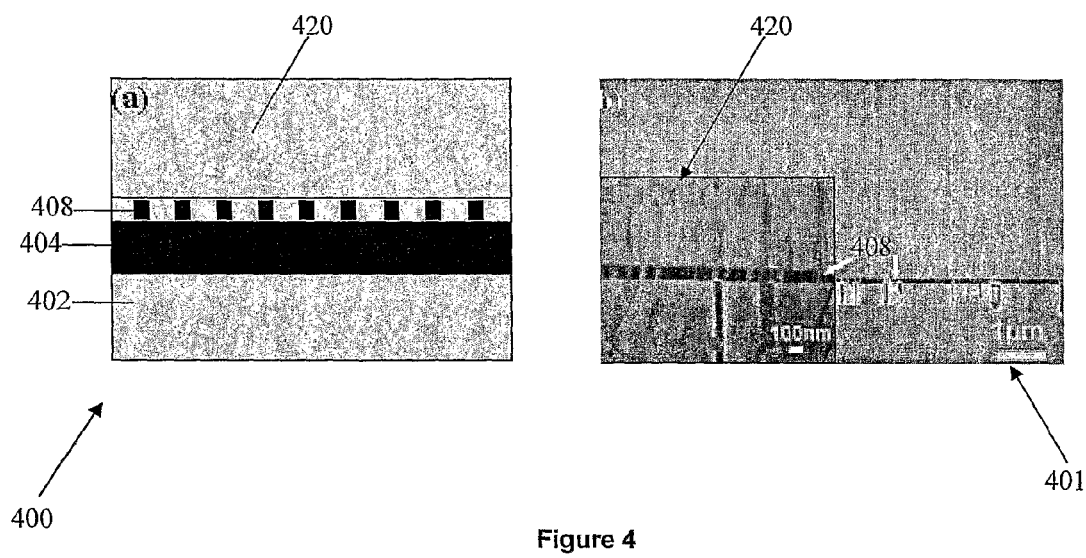
FIG. 4(a) is a the schematic cross-sectional diagram of a fabricated nano-epitaxial lateral overgrown (nano-ELO) GaN epitaxial structure, according to an embodiment of the present invention.
FIG. 4(b) is a corresponding SEM image of the schematic diagram of FIG. 4(a).

FIG. 4(a) is a schematic cross-sectional diagram of a fabricated nano-epitaxial lateral overgrown (nano-ELO) GaN epitaxial structure, designated generally as reference numeral 400, according to an embodiment of the present invention. The fabricated nano-epitaxial lateral overgrown (nano-ELO) GaN epitaxial structure 400 comprises a substrate 402, a GaN template 404, a nanostructured patterned sacrificial layer 408 and a nano-ELO GaN epitaxial layer 410.

FIG. 4(b) is a corresponding SEM image, designated generally as reference numeral 401, of the schematic diagram of FIG. 4(a). The inset 420 is an enlarged SEM image near the nanostructured patterned sacrificial layer 408.

FIG. 5(a) is a perspective view of a self lift-off nano-ELO GaN structure, designated generally as reference numeral 500, according to an embodiment of the present invention, which comprises a substrate 502, a GaN template 504, a nanostructured patterned sacrificial layer 508 and a nano-ELO GaN epitaxial layer 510. The nano-ELO GaN epitaxial layer 510 is preferably bonded to a silicon substrate (not shown) using epoxy as an adhesive. When the nano-ELO GaN epitaxial layer 510 is lifted off, it is attached to the bonded silicon substrate.

FIG. 5(b) is a perspective view of a self lift-off nano-ELO GaN structure, designated generally as reference numeral 501, according to an embodiment of the present invention, illustrating the lifting-off process at the interface between the nano-ELO GaN epitaxial layer 510 and the GaN template 504 after immersion in a suitable chemical solution. The nano-ELO GaN structure 500 can be immersed in suitable chemical solutions which can selectively remove the nanostructured patterned sacrificial layer 508 located between the GaN template 504 and the nano-ELO GaN epitaxial layer 510. These chemicals include, but are not limited to, hydrofluoric acid (HF) and BHF (to etch $SiO_2$ sacrificial layers), $H_3PO_4$ (to etch $Si_3N_4$ sacrificial layers) and $NH_4OH$ and $H_2O_2$ (to etch $TiO_2$ sacrificial layers), With the removal of the nanostructured patterned sacrificial layer 508, the nano-ELO GaN epitaxial layer 510 advantageously self-debonds at the interface between the nano-ELO GaN epitaxial layer 510 and the GaN template 504 and can then be lifted-off and separated from the substrate 502 and GaN template 504. The self-debonding is aided by the stress field produced during nano-epitaxy at the nano-ELO GaN epitaxial layer 510 and weak bonds at the interface.

FIG. 6(a) is a SEM image, designated generally as reference numeral 600, of a de-bonded nano-ELO GaN epitaxial layer 610 after a short period of etching (e.g. about 10 mins in about 20% HF solution). The nano-ELO GaN epitaxial layer 610 is de-bonded from a GaN template 604 and a substrate 602. A debonded air gap 612 (approximately 500 nm) is observed at the interface of the de-bonded nano-ELO GaN epitaxial layer 610 and the GaN template 604. FIG. 6(b) is a zoomed-out SEM image, designated generally as reference numeral 601, of SEM image 600.

Figure 7:
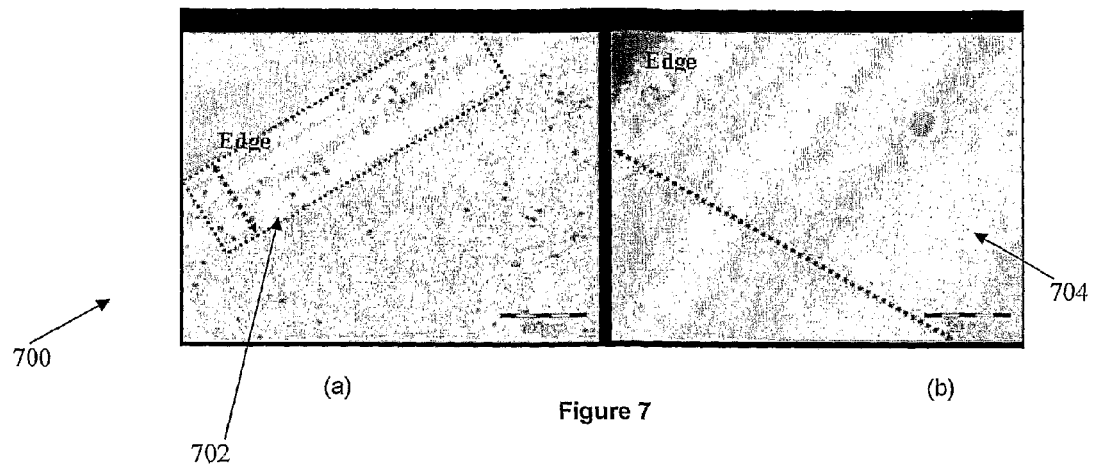
FIG. 7(a) is an optical microscopy image of the top surface of a nano-ELO GaN epitaxial layer after immersing in 20% HF solution for 10 mins.
FIG. 7(b) is an enlarged image of FIG. 7(a).

FIG. 7(a) is an optical microscopy image, designated generally as reference numeral 700, of the top surface of a nano-ELO GaN epitaxial layer after immersing in about 20% HF solution for about 10 mins. The area bounded by the dashed rectangle 702 indicates the lift-off region of the GaN epitaxial layer at the debonded interface. In this instance, the etching speed is estimated at about 10 μm/mins and the etching starts at the edge, where the HF reacts with the nanostructured patterned sacrificial layer. The etching rate can be increased if pure HF or higher concentration HF is used, instead of 20% HF. FIG. 7(b), designated generally as reference numeral 704, is an enlarged image of FIG. 7(a).

Figure 8:
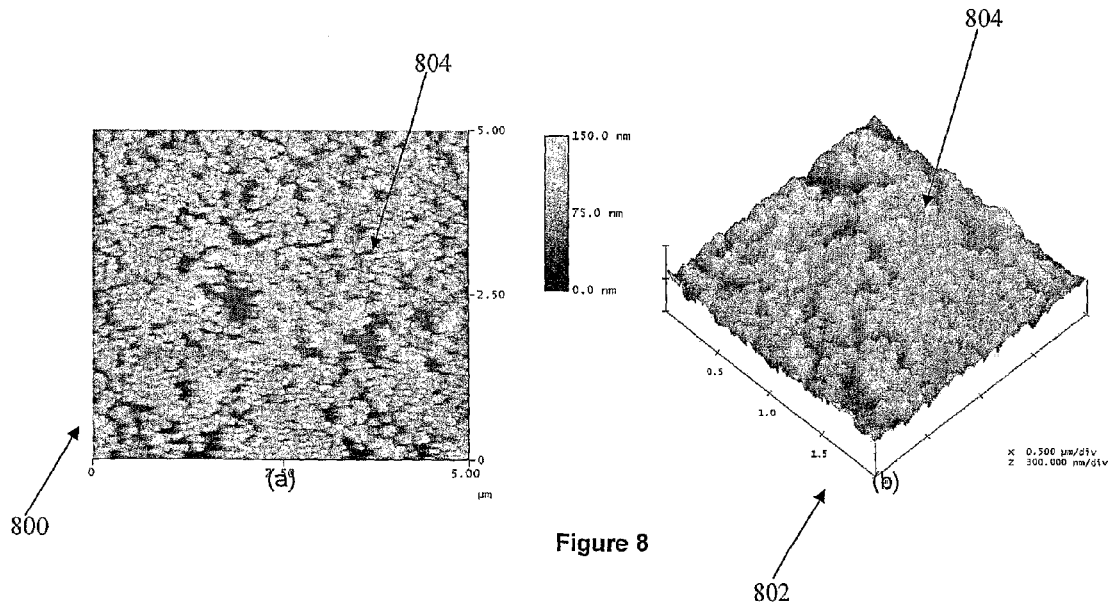
FIGS. 8(a) and (b) show atomic force microscopy (AFM) plan view and perspective view images respectively of the surface morphology of the debonded nano-ELO GaN epitaxial layer towards the nanostructured patterned sacrificial layer.

FIGS. 8(a) and (b) show atomic force microscopy (AFM) plan view 800 and perspective view 802 images respectively of the surface morphology of the debonded nano-ELO GaN epitaxial layer towards the nanostructured patterned sacrificial layer. Dense nanorod arrays 804 are observed on the surface. The diameter of a nanorod is approximately 60 nm, and the height is approximately 100 nm, which are of substantially the same dimensions as the nanopores of the nanostructured patterned sacrificial layer. This indicates that the de-bonding starts at the interface of the nano-ELO GaN epitaxial layer and the GaN template, as illustrated previously in FIG. 5. The nanostructures on the lift-off surface advantageously offer a rough surface, which may improve the light extraction efficiency for GaN based optoelectronic devices.

Figure 9:
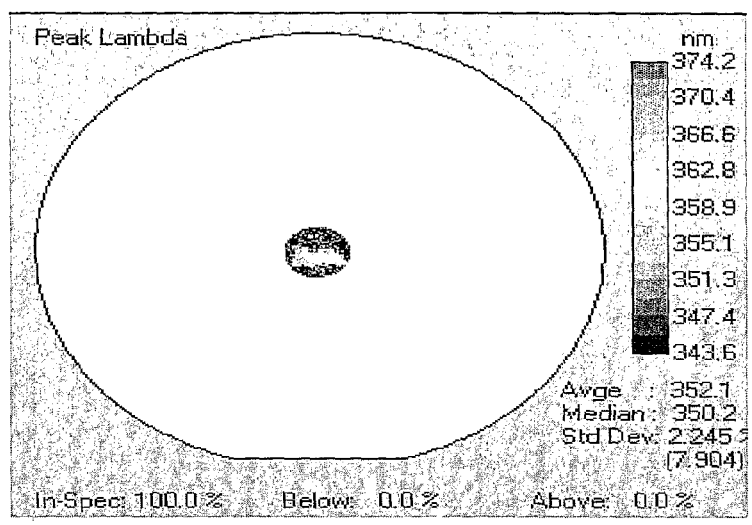
FIG. 9 is photoluminescence (PL) mapping image of a lifted-off nano-ELO GaN epitaxial layer on a silicon transfer substrate.

FIG. 9 is photoluminescence (PL) mapping image, designated generally as reference numeral 900, of a lifted-off nano-ELO GaN epitaxial layer on a silicon transfer substrate. In this instance, a nano-ELO GaN epitaxial layer of sample size 0.3 cm×0.5 cm is bonded to the silicon transfer substrate and followed by lift-off for about 5 hours. After 5 hours of immersion in HF solution, the nano-ELO GaN epitaxial layer is detached from the sapphire substrate. The PL mapping profile illustrates the uniformity of the nano-ELO GaN epitaxial layer on the silicon transfer substrate. The PL peak intensity is found to have substantially increased compared to the nano-ELO GaN epitaxial layer before lift off.

Figure 10A:
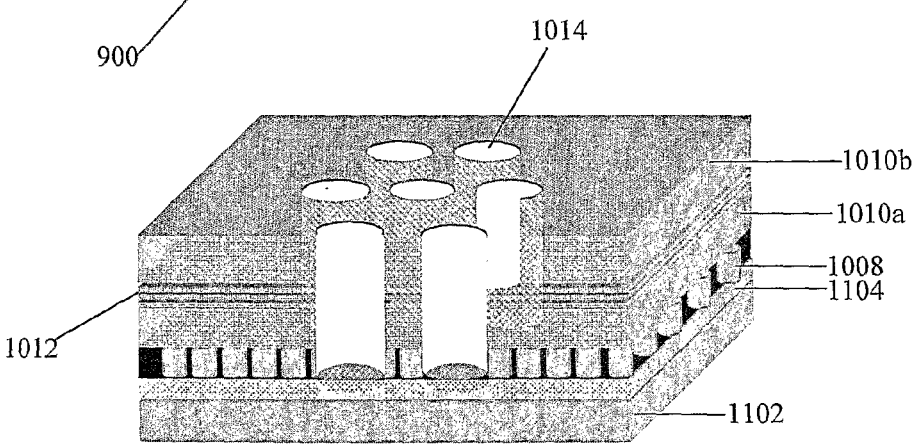
FIGS. 10(a) and (b) are perspective views of a self lift-off nano-ELO GaN structure, according to another alternative embodiment of the present invention.
Figure 10B:
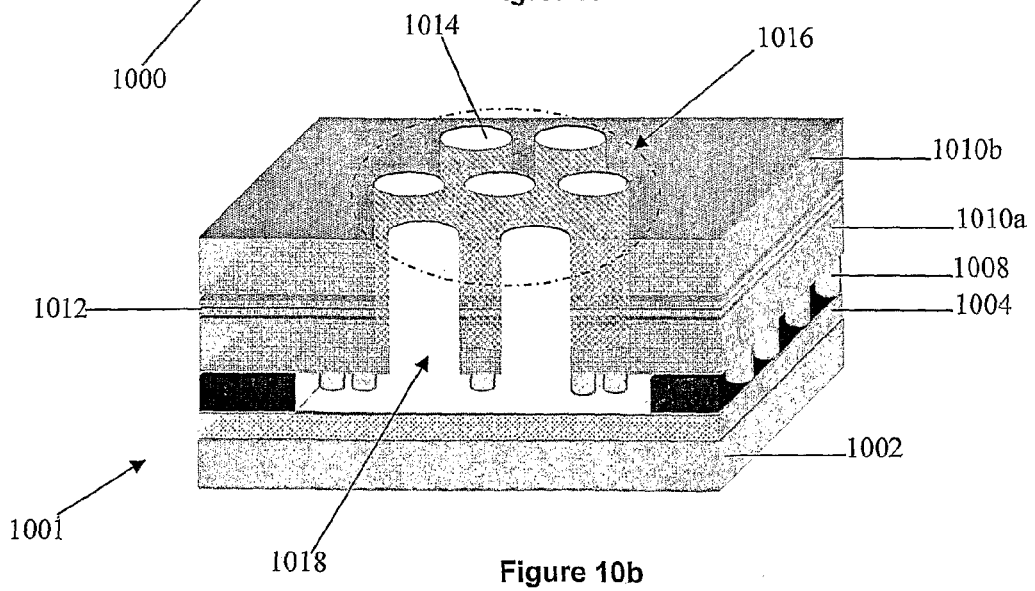

FIGS. 10(a) and (b) are perspective views of a nano-ELO GaN structure, designated generally as reference numerals 1000 and 1001 respectively, according to another alternative embodiment of the present invention, comprising a substrate 1002, a GaN template 1004, a nanostructured patterned sacrificial layer 1008, nano-ELO GaN epitaxial layers 1010a, b that sandwich a quantum well 1012, and a plurality of photonic holes (e.g.: 1014) that are formed e.g. by patterning and dry etching. FIG. 10b) is a perspective view of a nano-ELO GaN structure in which an etchant (e.g. HF solution) enters the plurality of photonic holes and partially releases the nano-ELO GaN epitaxial layer 1010a to define an optical cavity 1016 in the nano-ELO GaN epitaxial layers 1010a, b. In this embodiment, the lateral size of the optical cavity 1016 can be controlled by controlling the etching time and the thickness of the patterned sacrificial layer 1008, and the vertical dimension of the optical cavity 1016 can be controlled by the thickness of the nano-ELO GaN epitaxial layers 1010a, b.

The photonic holes advantageously provide in-plane modal confinement for the optical cavity 1016 due to distributed Bragg reflection, and the undercut 1018 advantageously provides the vertical optical confinement by total internal reflection. Compared to using existing continuous sacrificial layers or PEC lift off methods, the material for the patterned sacrificial layer in example embodiments can be chosen based on exhibiting an optimized quality which can provide the desired device performance, for example, better output power for laser devices.

Alternatively, an optical cavity may be fabricated in the form of an undercut disk using the method in accordance with an embodiment of the present invention, where the wet etch of the patterned sacrificial layer underneath the starts from the edge of the disk, the disk having been formed initially e.g. by patterning and dry etching.

In the above example embodiments, better control can be achieved due to e.g. better etching selectivity, and simplicity of the process.

Figure 11A:
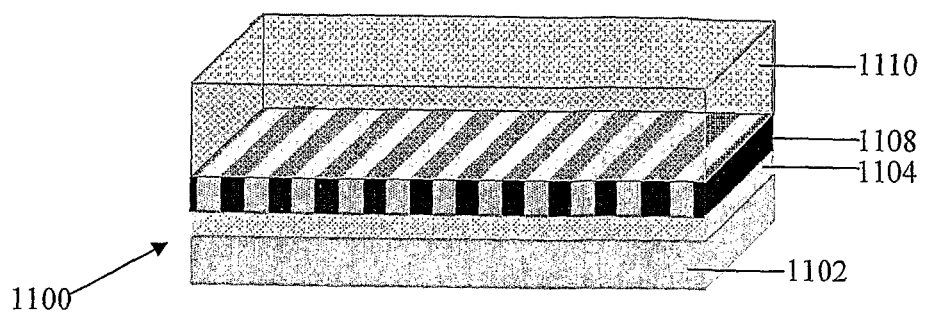
FIGS. 11(a) and (b) are perspective views of a self lift-off nano-ELO GaN structure, according another alternative embodiment of the present invention, FIGS. 12(a) and (b) are schematic cross-sectional diagrams of a self lift-off nano-ELO GaN structure, according to another embodiment of the present invention.

FIGS. 11(a) and (b) are perspective views of a self lift-off nano-ELO GaN structure, designated generally as reference numerals 1100 and 1101 respectively, according to another alternative embodiment of the present invention, comprising a substrate 1102, a GaN template 1104, a nanostructured patterned sacrificial layer 1108, and a nano-ELO GaN epitaxial layer 1110. In this alternative embodiment of the present invention, the nanostructured patterned sacrificial layer 1108 is in the form of networks of stripe lines, resulting in the formation of diffraction gratings on the surface of the lifted-off nano-ELO structure. In such an embodiment, the diffraction gratings can provide advantages in micro-optical systems.

Figure 11B:
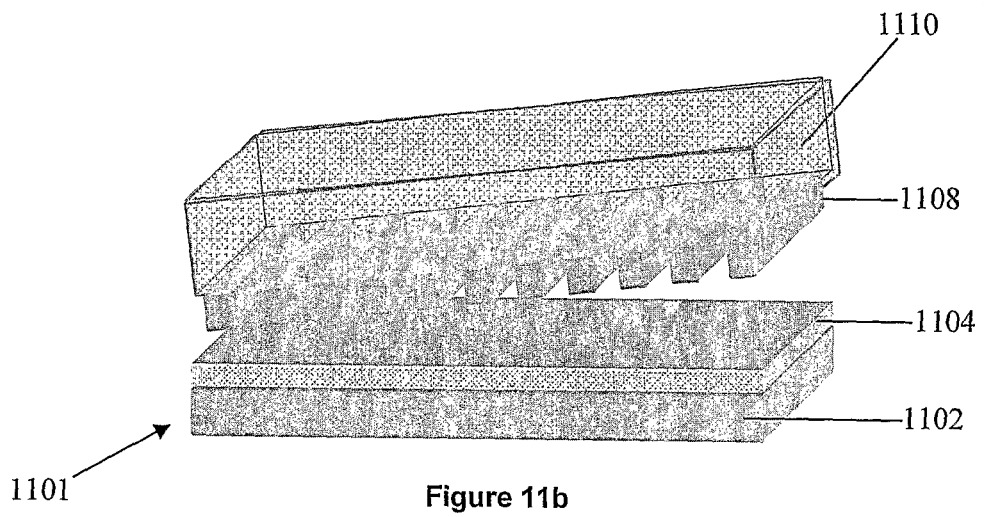

FIG. 11(a) is a cross-sectional view of the nano-ELO GaN epitaxial layer 1110 prior to lifting-off from the substrate 1102 and GaN template 1104. FIG. 11(b) is a cross-sectional view of the nano-ELO GaN epitaxial layer 1210 that has been lifted off from the substrate 1102 and GaN template 1104.

Figure 12A:
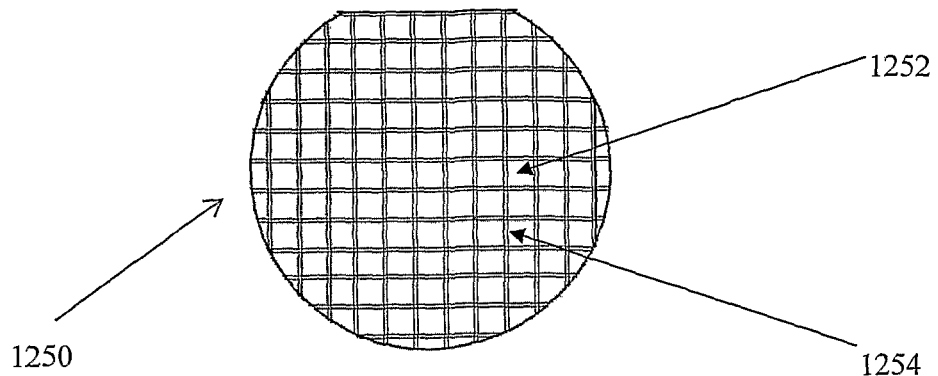
FIG. 12(c) is a top view schematic of a wafer comprising trenches, according to the embodiment described above.

To demonstrate the possibility to scale up to larger wafer size (e.g. future 3" wafer) and reduce the total lift-off time in different embodiments, the wafer is etched in deep trenches to form mesas. With reference to FIG. 12(a), in one embodiment, each mesa 1252 on the wafer 1250 comprises a structure as e.g. described above with reference to FIG. 1(d). The trenches e.g. 1254 to define the e.g. about 300 μm×300 μm mesas 1252 are formed by using Induced Coupled Plasma (ICP) etching in one embodiment. For example, the width of the trench can be from about 2 μm to about 100 μm and the depth of the trench can be from the sample surface to the sacrificial layer depending on the sample thickness, for example, it can be about 8 μm). The actual lift-off time can thus be greatly reduced to about 20 mins in one example. Therefore, as device size in e.g. the LED and transistor industry continues to reduce, and thus more devices can be formed on each single wafer, and in particular if larger wafers are used in the future, the etching rate and the etching scale will not affected by the wafer size. It was observed that the etching starts at the edge of each mesa 1252, i.e. from the trenches e.g. 1254, where the HF reacts with the $SiO_2$. The etching continues towards the center of each mesa 1252. Optical fringes and a bright contrast between the undercut region and non-undercut regions were observed. Using in situ optical microscopy, the lateral etch rate was estimated to be about 15 μm/min for lifting off an about 300 μm×300 μm mesa area in one example, and the about 300 μm×300 μm mesa was found completely lifted off within 20 minutes.

Figure 12B:
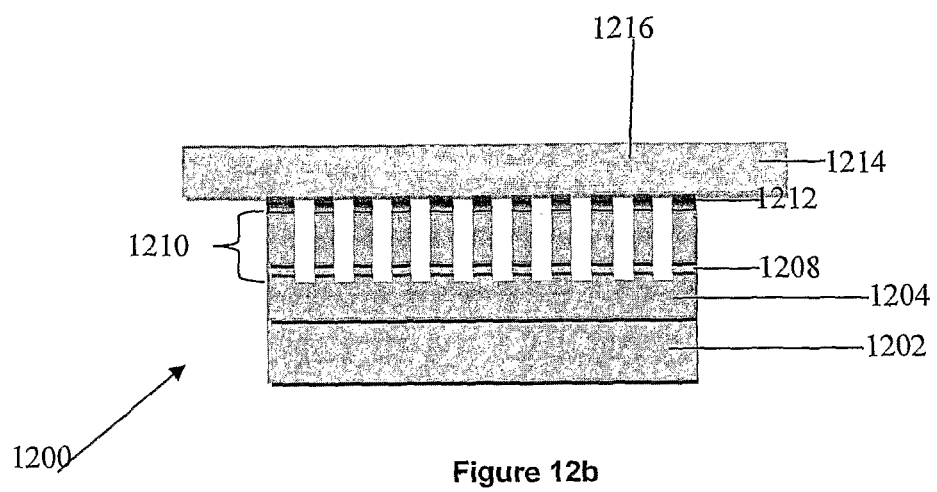
Figure 12C:
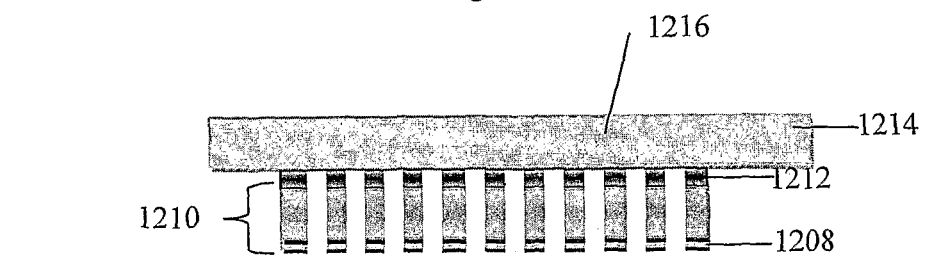

FIGS. 12(b) and (c) are schematic cross-sectional diagrams of a self lift-off nano-ELO GaN structure, designated generally as reference numerals 1200 and 1201 respectively, according to such an embodiment of the present invention. The self lift-off nano-ELO GaN structures 1200/1201 comprise a substrate 1202, a GaN template 1204, a nanostructured patterned sacrificial layer 1208 and a nano-ELO GaN epitaxial mesas 1210 that are bonded to a silicon substrate 1214 using epoxy 1212 as an adhesive, for lift-off. Each mesa 1210 may comprise a structure as e.g. described above with reference to FIG. 1(d). FIG. 12(a) is a cross-sectional view of the nano-ELO GaN epitaxial mesas 1210 prior to lifting-off from the substrate 1202 and GaN template 1204. FIG. 12(b) is a cross-sectional view of the nano-ELO GaN epitaxial mesas 1210 after lifting-off from the substrate 1202 and GaN template 1204.

An example practical application of the method according to embodiments of the present invention will now be described. With reference to FIG. 1d), after formation of a n-GaN epitaxial layer (compare 110 in FIG. 19d), an InGaN MQWs layer is next formed on top of the n-GaN layer, followed by a p-GaN layer. Next, a back contact/mirror structure is deposited, and bonded to a transfer substrate using an epoxy. The resulting structure is then subjected to the lift-off process according to embodiments of the present invention.

Figure 13:
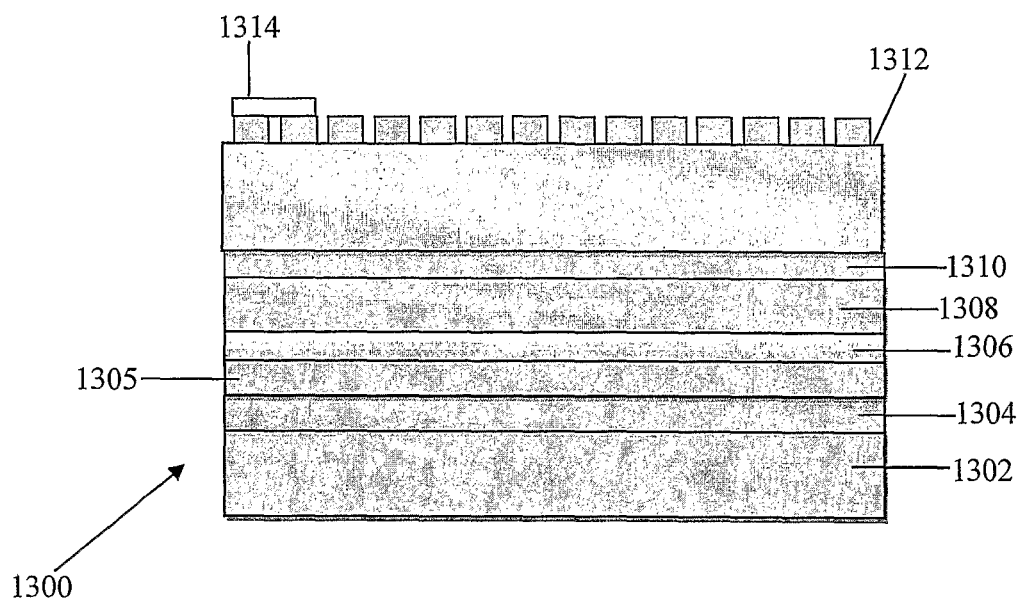
FIG. 13 is a cross-sectional schematic diagram of a vertical GaN LED device.

FIG. 13a) is a cross-sectional schematic diagram of a vertical GaN LED device, designated generally as reference numeral 1300, after lift-off. The device in this example comprises a copper (transfer) substrate 1302, a silver epoxy bonding layer 1304, a back-contact 1305, a mirror layer 1306, a p-GaN layer 1308, an InGaN MQWs layer 1310, and a n-GaN layer 1312. An n-metal contact 1314 is disposed on the n-GaN layer 1312 (after lift-off). Materials for the back-contact 1305 can include, but are not limited to a Ni/Au bilayer. Materials for the mirror layer 1306 can include, but are not limited to Ti/Al, or Ti/Ag bilayers.

FIG. 13b) shows the Blue electro luminescence (EL) emission measured from a fabricated example device according to FIG. 13a).

Figure 14:
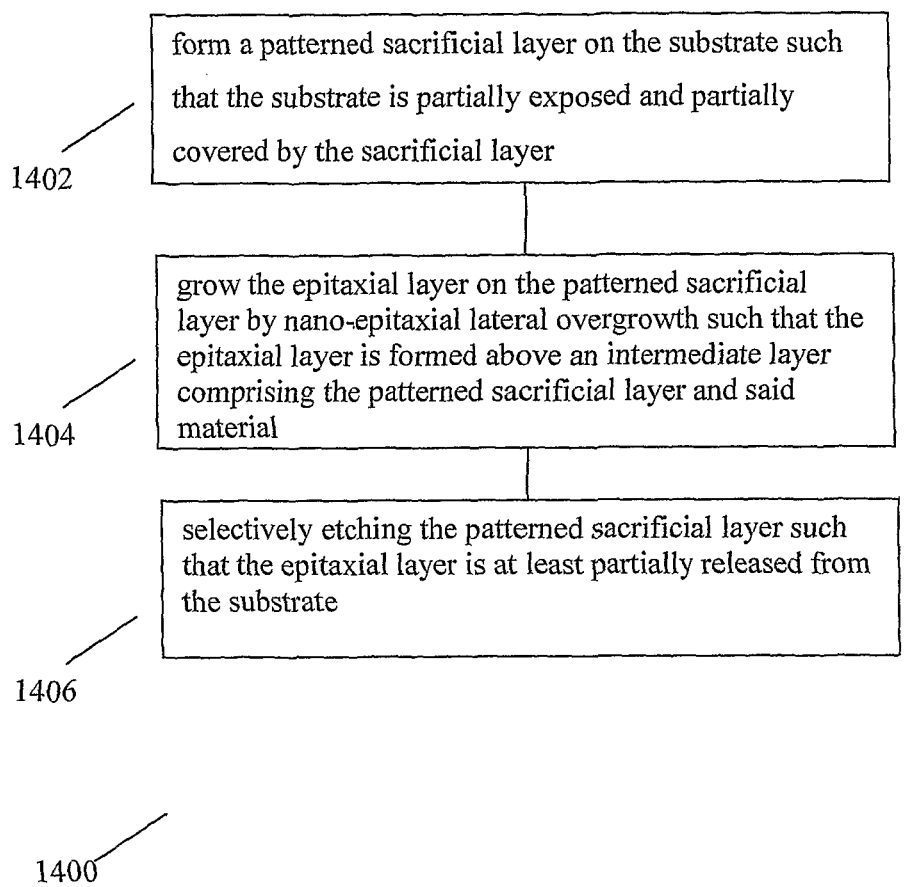
FIG. 14 is a flow-chart illustrating a method of at least partially releasing an epitaxial layer of a material from a substrate, according to an embodiment of the present invention.

FIG. 14 is a flow-chart, designated generally as reference numeral 1400, illustrating a method of at least partially releasing an epitaxial layer of a material from a substrate, according to an embodiment of the present invention. At step 1402, a patterned sacrificial layer is formed on the substrate such that the substrate is partially exposed and partially covered by the sacrificial layer. At step 1404, the epitaxial layer is grown on the patterned sacrificial layer by nano-epitaxial lateral overgrowth such that the epitaxial layer is formed above an intermediate layer comprising the patterned sacrificial layer and said material. At step 1406, the patterned sacrificial layer is selectively etched such that the epitaxial layer is at least partially released from the substrate.

Embodiments of the present invention provide a method of lifting-off Group III-V Nitride based epitaxial layers, which is advantageously simple in design, enables accurate control, inexpensive and can be scaled up to a larger wafer size and used in batch processing. The method according to embodiments of the present invention also advantageously enable the production of Group III-V nitride epilayers, in particular GaN epilayers, with a high crystal quality and low defect density as a result of nano-epitaxial growth. This can enable the fabrication of high-efficiency and high power optoelectronic including light emitting diodes, laser diodes, or High Electron Mobility Transistors (HEMTs) on a large scale.

The method according to embodiments of the present invention can also be used to lift-off Group III-V nitride based optoelectronic devices, i.e. light emitting diodes and laser diodes, on a large scale for mounting onto a heat sink for better heat dissipation and better crystal quality for high power usage.

Embodiments of the present invention also provide a method which does not damage the separated substrate, advantageously enabling the substrate to be recycled.

Characteristics of the method of lifting-off Group III-V Nitride based epitaxial layers, according to embodiments of the present invention, are (i) patterned sacrificial layer materials that can be selectively removed by wet chemicals (e.g. HF solution) and (ii) a nanostructured patterned sacrificial layer enabling the self de-bonding of a nano-ELO Group III-V Nitride layer at the interface after removal of a patterned sacrificial layer.

It will be appreciated by a person skilled in the art that numerous variations and/or modifications may be made to the present invention as shown in the embodiments without departing from a spirit or scope of the invention as broadly described. The embodiments are, therefore, to be considered in all respects to be illustrative and not restrictive.

For example, the invention is not limited to the material systems described in the above example embodiments. The present invention can apply more generally to materials that can be grown on a patterned sacrificial layer by nano-epitaxial lateral overgrowth such that an epitaxial layer is formed above an intermediate layer comprising the patterned sacrificial layer and the material; and selectively etching the patterned sacrificial layer such that the epitaxial layer is at least partially released from the substrate. In some embodiments, the mechanical force at the interface can be exploited to separate the epitaxial layer leaving with nano-column structures for lift-off from the substrate.

The invention claimed is:

1. A method of at least partially releasing an epitaxial layer of a material from a substrate, the method comprising the steps of:
   forming a patterned sacrificial layer on the substrate such that the substrate is partially exposed and partially covered by the sacrificial layer;
   growing the epitaxial layer on the patterned sacrificial layer by nano-epitaxial lateral overgrowth such that the epitaxial layer is formed above an intermediate layer comprising the patterned sacrificial layer and said material; and selectively etching the patterned sacrificial layer such that the epitaxial layer debonds from the substrate for lift-off.

2. The method as claimed in claim 1, wherein the substrate comprises a template layer for promoting the nano-epitaxial overgrowth.

3. The method as claimed in claim 2, wherein the patterned sacrificial layer is selectively etched such that the epitaxial layer debonds from the template layer for lift-off.

4. The method as claimed in claim 3, wherein the epitaxial layer debonds at an interface between the template layer and nano-structures of said material formed on the template layer as part of the nano-epitaxial growth of the epitaxial layer.

5. The method as claimed in claim 2, wherein the template layer and epitaxial layer comprises a Group III-V nitride; or a Group III-V nitride ternary or quaternary alloy.

6. The method as claimed in claim 5, wherein the Group III-V nitride comprises one or more of a group consisting of aluminum nitride (AlN), gallium nitride (GaN), indium nitride (InN), aluminum gallium nitride (AlGaN) and indium gallium nitride (InGaN).

7. The method as claimed in claim 1, wherein the substrate comprises one or more of a group consisting of silicon (Si), silicon carbide (SiC) and sapphire.

8. The method as claimed in claim 2, wherein the template layer is formed by a method comprising one or more of a group consisting of metal-organic chemical vapor deposition (MOCVD), molecular beam epitaxy (MBE) or hydride vapour phase epitaxy (HVPE).

9. The method as claimed in claim 1, wherein the patterned sacrificial layer is formed by a method comprising one or more of a group consisting of plasma enhanced chemical vapor deposition (PECVD), sputtering or spin-on glass.

10. The method as claimed in claim 1, wherein the patterned sacrificial layer comprises one or more of a group consisting of silicon dioxide ($SiO_2$), silicon nitride ($Si_3N_4$), and titanium oxide ($TiO_2$).

11. The method as claimed in claim 1, wherein the patterned sacrificial layer is patterned by a method comprising one or more of a group consisting of nanoimprint lithography (NIL), use of anodized aluminum oxide (AAO) as an etch mask, electron beam lithography and interference lithography.

12. The method as claimed in claim 1, wherein the nano-epitaxial lateral overgrowth is formed by a method comprising one or more of a group consisting of metal-organic chemical vapor deposition (MOCVD), molecular beam epitaxy (MBE) or hydride vapour phase epitaxy (HVPE).

13. The method as claimed in claim 1, wherein the patterned sacrificial layer comprises a plurality of pores, dots or strips.

14. The method as claimed in claim 1, further comprising, prior to etching the patterned sacrificial layer, forming trenches in the substrate to define mesa structures on the substrate, whereby etching of the patterned sacrificial layer in the regions of the mesa structures is facilitated.

15. The method as claimed in claim 1, wherein the step of forming the patterned sacrificial layer comprises selecting a pattern based on desired optical characteristics of the lift-off epitaxial layer.

16. The method as claimed in claim 15, wherein the pattern is selected to increase a surface roughness of the lift-off epitaxial layer.

17. The method as claimed in claim 15, wherein the pattern is selected to provide a diffraction grating on a surface of the lift-off epitaxial layer.

18. A device comprising an epitaxial layer at least partially released using a method as claimed in claim 1.

19. The device as claimed in claim 18, comprising an LED structure, a Laser Diode or a High Electron Mobility Transistor.

20. A method of at least partially releasing an epitaxial layer of a material from a substrate, the method comprising the steps of:

forming a patterned sacrificial layer on the substrate such that the substrate is partially exposed and partially covered by the sacrificial layer;

growing the epitaxial layer on the patterned sacrificial layer by nano-epitaxial lateral overgrowth such that the epitaxial layer is formed above an intermediate layer comprising the patterned sacrificial layer and said material;

forming one or more holes in the epitaxial layer for entry of an etching agent to contact the patterned sacrificial layer; and selectively etching the patterned sacrificial layer with the etching agent such that the epitaxial layer is at least partially released from the substrate.

21. The method as claimed in claim 20, wherein the patterned sacrificial layer is selectively etched such that the epitaxial layer is undercut or such that a cavity is formed underneath the epitaxial layer.

22. The method as claimed in claim 20, wherein the holes are formed as photonic holes for providing an optical cavity in the epitaxial layer.

* * * * *